(12) United States Patent
Khan et al.

(10) Patent No.: US 7,061,299 B2
(45) Date of Patent: Jun. 13, 2006

(54) BIDIRECTIONAL LEVEL SHIFTER

(75) Inventors: Qadeer A. Khan, New Delhi (IN);
Sanjay K. Wadhwa, Saharanpur (IN);
Kulbhushan Misri, Gurgaon (IN)

(73) Assignee: Freescale Semiconductor, INC, Austin, TX (US)

( * ) Notice: Subject to any disclaimer, the term of this patent is extended or adjusted under 35 U.S.C. 154(b) by 0 days.

(21) Appl. No.: 11/199,017

(22) Filed: Aug. 8, 2005

(65) Prior Publication Data

US 2006/0055570 A1 Mar. 16, 2006

Related U.S. Application Data

(63) Continuation of application No. 10/774,130, filed on Feb. 6, 2004, now abandoned.

(51) Int. Cl.
*H03L 5/00* (2006.01)

(52) U.S. Cl. ............................ 327/333; 326/68; 326/81

(58) Field of Classification Search ................ 327/333; 326/68, 80, 81; 365/189.11
See application file for complete search history.

(56) References Cited

U.S. PATENT DOCUMENTS

| | | | | |
|---|---|---|---|---|
| 4,150,308 A | | 4/1979 | Adlhoch ...................... 326/68 |
| 5,877,633 A | * | 3/1999 | Ng et al. ...................... 326/81 |
| 6,404,229 B1 | * | 6/2002 | Barnes ........................ 326/68 |
| 6,512,401 B1 | | 1/2003 | Clark et al. .................. 327/112 |
| 6,556,061 B1 | | 4/2003 | Chen et al. .................. 327/333 |
| 6,600,679 B1 | | 7/2003 | Tanzawa et al. ........ 365/189.11 |
| 6,842,043 B1 | * | 1/2005 | Nguyen et al. ................ 326/68 |
| 6,954,100 B1 | * | 10/2005 | Dharne et al. ............... 327/333 |
| 2003/0001655 A1 | | 1/2003 | Jeong ........................ 327/333 |
| 2003/0098711 A1 | | 5/2003 | Tsuboi et al. .................. 326/81 |
| 2003/0112041 A1 | | 6/2003 | Clark et al. .................. 327/112 |
| 2003/0117207 A1 | | 6/2003 | Suk et al. ..................... 327/333 |
| 2005/0057296 A1 | | 3/2005 | Dharne et al. ............... 327/333 |

FOREIGN PATENT DOCUMENTS

EP 0 608 489 B1 12/1997
EP 1 191 694 A1 3/2002

OTHER PUBLICATIONS

Schutte, Herman; "Bidirectional level shifter for $I^2C$-bus and other systems"; Aug. 4, 1997; pp. 1-16; Phillips Semiconductors Application Note #AN97055; The Netherlands.

* cited by examiner

*Primary Examiner*—Long Nguyen
(74) *Attorney, Agent, or Firm*—Charles Bergere

(57) ABSTRACT

A bi-directional level shifter for shifting a digital signal from a low power supply voltage level to a high power supply voltage level and vice versa includes first and second I/O terminals, a first circuit operating at a low power supply voltage, and a second circuit operating at a high power supply voltage. The first circuit and the second circuit are connected to both of the I/O terminals. When a low voltage digital signal is applied at the first I/O terminal, a high voltage digital signal is generated at the second I/O terminal. Similarly, if a high voltage digital signal is applied at the second I/O terminal, a low voltage digital signal is generated at the first I/O terminal.

6 Claims, 4 Drawing Sheets

500

BIDIRECTIONAL LEVEL SHIFTER

This application is a continuation of U.S. application Ser. No. 10/774,130, entitled "BIDIRECTIONAL LEVEL SHIFTER", filed on Feb. 6, 2004, now abandoned, and is assigned to the assignee of record thereof.

BACKGROUND OF THE INVENTION

The present invention relates generally to digital logic circuits and more particularly, to level shifter circuits for shifting digital signal between two different voltage levels.

Digital logic circuits are widely used in the area of electronics and computers. However, with advances in circuit technology, the various digital logic circuits that communicate with one another may operate at different power supply voltages. For example, a digital integrated circuit may include an input/output (I/O) portion operating at a first logic level and a central logic core that operates at a second, lower supply voltage, since operating at the lower voltage reduces power consumption. On the other hand, the supply voltage for the I/O section of the integrated circuit must be kept at a higher supply voltage than the logic core. This is done to ensure a higher signal to noise ratio. For example, the I/O section may operate at supply voltages ranging from 3.3V to 5V while the logic core operates at 0.5V to 1.5V. Thus, an interface is required to ensure smooth communication between different digital logic circuits operating at different voltages.

In particular, the interface must allow a shift in the voltage of a digital signal from a high voltage level to a low voltage level and vice versa. For example, if a first digital logic circuit has an operating voltage of 1.5V and a second circuit has an operating voltage of 2.5V, then for the first circuit, a high logic signal implies a signal with a voltage between 1.0V and 1.5V. On the other hand, for the second circuit, a high logic signal implies a signal with a voltage between 2.0V and 2.5V. If the two circuits are connected, then an interface is needed to convert a logic high signal from the first circuit to a logic high signal for the second circuit. This is necessary to ensure that there is no error in reading a digital signal across the two circuits. For example, if a logic high signal (about 1.0V) generated by the first circuit is supplied to the second circuit without level shifting, then the 1.0V signal will be interpreted by the second circuit as a logic low signal rather than a logic high signal and therefore, the system will not work properly.

Similarly, another interface is required to shift a logic high signal (~2.5V) generated by the second circuit to a logic high signal (~1.5V) to be applied to the first circuit. A shift in voltage level from the high voltage to the low voltage level also is essential to avoid damage to the first circuit.

Accordingly, there is a need for a device that allows shifting of the voltage levels of digital signals from a high voltage level to a low voltage level and vice versa.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

Figure 1:
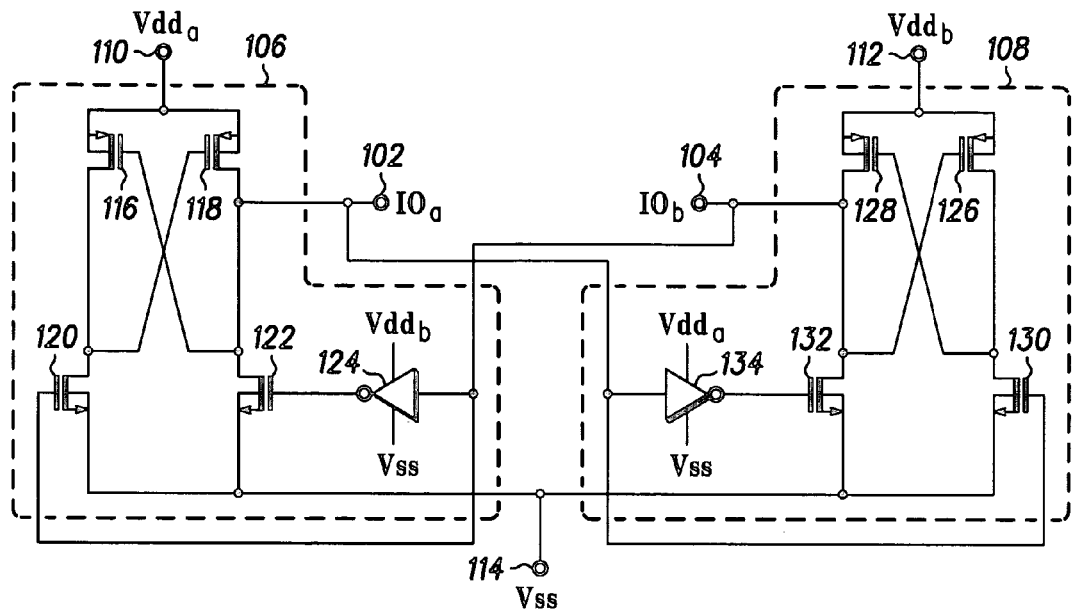
FIG. 1 is a schematic circuit diagram of a bi-directional level shifter circuit according to an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

For convenience, terms that have been used in the description of various embodiments are defined below. It is to be noted that these definitions are provided merely to aid the understanding of the description, and are, in no way, to be construed as limiting the scope of the invention.

The term "Reset voltage" is the least voltage at which a circuit operates. Reset voltage is provided to a circuit using a negative voltage source (<0V) or a ground voltage (0V) source.

The term "low voltage digital signal" is defined as a digital signal in which a LOW logic value corresponds to a reset voltage and a HIGH logic value corresponds to a low power supply voltage.

The term "high voltage digital signal" is defined as a digital signal in which a LOW logic value corresponds to the reset voltage and a HIGH logic value corresponds to a high power supply voltage.

For example, suppose the low power supply voltage has a value of 1.2V, the high power supply voltage has a value of 2.5V and the reset voltage is 0V. A logic HIGH level for the low voltage digital signal has a value of about 1.2V, while that for logic LOW has a value of about 0V. Similarly, for the high voltage digital signal, logic HIGH has a value of about 2.5V, while logic LOW has a value of about 0V.

The present invention is directed to a bi-directional level shifter for shifting a voltage signal from a low voltage level to a high voltage level and vice-versa. The level shifter comprises a first I/O terminal, a second I/O terminal, a first circuit and a second circuit. The first circuit operates at a low power supply voltage while the second circuit operates at a high power supply voltage or vice-versa. A low voltage digital signal is level shifted to a high voltage digital signal by applying the low voltage digital signal as an input at the first I/O terminal. The high voltage digital signal is then generated by the first and second circuits and provided at the second I/O terminal. Similarly, a high voltage digital signal is level shifted to a low voltage digital signal by applying the high voltage digital signal at the second I/O terminal as an input. The low voltage digital signal is then generated by the first and second circuits and provided at the first I/O terminal. The first and second circuits each include a plurality of PMOS and NMOS transistors. As is understood by those of skill in the art, PMOS transistors include a source, a drain and a gate. The transistors may also include a bulk terminal. Unless noted otherwise, the bulk terminal is connected to the source.

The bi-directional level shifter of the present invention has several advantages. In particular, the bi-directional level shifter can be used as an interface for devices that are bi-directional in nature. It eliminates the need of two different level shifters and associated mode control signal when level shifting in both the directions (Transmit/Receive) is required. A common level shifter for interfacing the devices reduces the area required on the integrated circuit. In addition, the signal delay associated with the level shifting is decreased and there is no change in duty cycle/delay of the signal because the circuit is fully symmetric. The level shifter circuit can be used in Tri-state IO pads, can be made as a standard cell, can be fully integrated, can be designed in any CMOS technology and is useful for Dynamic Voltage Frequency Scaling (DVFS) applications.

FIG. 1 is a schematic circuit diagram of a bi-directional level shifter circuit 100, in accordance with an embodiment of the present invention. The level shifter circuit 100 includes a first I/O terminal 102, a second I/O terminal 104, a first circuit 106 operating at a low power supply voltage (VDDa) and a second circuit 108 operating at a high power supply voltage (VDDb). The power supply voltage for the second circuit 108 is greater than that for the first circuit 106. To shift a low voltage digital signal to a high voltage digital signal, the first I/O terminal 102 receives a low voltage digital signal (IOa) as an input to the level shifter circuit 100, while the second I/O terminal 104 provides the high voltage digital signal (IOb) as an output of the level shifter circuit 100. To shift a high voltage digital signal to a low voltage digital signal, the second I/O terminal 104 receives the high voltage digital signal (IOb) as an input to the level shifter circuit 100, while the first I/O terminal 102 provides the low voltage digital signal (IOa) as an output of the level shifter circuit 100. Thus, the level shifter circuit 100 operates in a bi-directional manner, shifting a low voltage digital signal to a high voltage digital signal, and shifting a high voltage digital signal to a low voltage digital signal.

The first circuit 106 includes a first PMOS transistor 116, a second PMOS transistor 118, a first NMOS transistor 120, a second NMOS transistor 122 and a first inverter 124. The first circuit 106, which operates at the low power supply voltage, is connected to the low power supply voltage source (VDDa) at a terminal 110 and a reset or reference voltage source (VSS) at a terminal 114.

The sources of the first and second PMOS transistors 116 and 118 are connected to the low power supply voltage source (VDDa) via the terminal 110. The drain of the first PMOS transistor 116 is connected to the drain of the first NMOS transistor 120, while the drain of the second PMOS transistor 118 is connected to the drain of the second NMOS transistor 122 as well as the first I/O terminal 102. The gate of the first PMOS transistor 116 is connected to the drain of the second NMOS transistor 122, while the gate of the second PMOS transistor 118 is connected to the drain of the first NMOS transistor 120. The sources of the first and second NMOS transistors 120 and 122 are connected to the reset or reference voltage (VSS). The gate of the first NMOS transistor 120 is connected to the second I/O terminal 104. The gate of the second NMOS transistor 122 is connected to an output of the first inverter 124.

The input of the first inverter 124 is connected to the second I/O terminal 104. The first inverter 124 is also connected to the high power supply voltage (VDDb) and the reset voltage (VSS). The first inverter 124 provides as an output either the high power supply voltage (VDDb) or the reset voltage (VSS). If the input to the first inverter 124 is a logic LOW signal then the output is a logic HIGH signal at the high power supply voltage (VDDb). If a logic HIGH signal at the high power supply voltage is applied as an input to the first inverter 124, then the output of the first inverter 124 is a logic LOW at the reset voltage.

The second circuit 108 is very similar to the first circuit 106. The second circuit 108 includes a third PMOS transistor 126, a fourth PMOS transistor 128, a third NMOS transistor 130, a fourth NMOS transistor 132 and a second inverter 134. The second circuit 108, which operates at the high power supply voltage (VDDb), is connected to a high power supply voltage source via a terminal 112 and to the reset voltage source via the terminal 114.

The sources of the third and fourth PMOS transistors 126 and 128 are connected to the high power supply voltage (VDDb) via the terminal 112. The drain of the third PMOS transistor 126 is connected to the drain of the third NMOS transistor 130, while the drain of the fourth PMOS transistor 128 is connected to the drain of the fourth NMOS transistor 132 as well as the second I/O terminal 104. The gate of the third PMOS transistor 126 is connected to the drain of the fourth NMOS transistor 132 and the gate of the fourth PMOS transistor 128 is connected to the drain of the third NMOS transistor 130. The sources of the third and fourth NMOS transistors 130 and 132 are connected to the reset voltage (VSS) via the terminal 114. The gate of the third NMOS transistor 130 is connected to the first I/O terminal 102. The gate of the fourth NMOS transistor 132 is connected to an output of the second inverter 134.

The input of the second inverter 134 is connected to the first I/O terminal 102. The second inverter 134 is also connected to the low power supply voltage (VDDa) and the reset voltage (VSS). The second inverter 134 provides as an output either the low power supply voltage (VDDa) or the reset voltage (VSS).

If the input to the second inverter 134 is a logic LOW signal then the output is a logic HIGH signal at the low power supply voltage (VDDa). If a logic HIGH signal at the low power supply voltage (VDDa) is input to the second inverter 134, then the output of the second inverter 134 is a logic LOW signal (VSS).

The operation of the bi-directional level shifter 100 during the shift of a low voltage digital signal to a high voltage digital signal and vice versa, is described hereinafter.

In order to shift a low voltage digital signal to a high voltage digital signal, the low voltage digital signal is applied at the first I/O terminal 102 as an input. If the low voltage digital signal has a logic HIGH value (i.e., the signal has a value close to the low power supply voltage), then the third NMOS transistor 130 and the fourth PMOS transistor 128 are switched ON. Also, the third PMOS transistor 126 and the fourth NMOS transistor 132 are switched OFF. Consequently, a voltage close to the high power supply voltage (VDDb), i.e., a logic HIGH, is generated at the second I/O terminal 104. In the first circuit 106, the second PMOS transistor 118 and the first NMOS transistor 120 are switched ON and the first PMOS transistor 116 and the second NMOS transistor 122 are switched OFF.

If a low voltage digital signal applied at the first I/O terminal 102 has logic LOW value, i.e., close to the reset voltage, then the third PMOS transistor 126 and the fourth NMOS transistor 132 are switched ON. Also, the third NMOS transistor 130 and the fourth PMOS transistor 128 are switched OFF. Consequently, a voltage close to the reset voltage, i.e., logic LOW, is generated at the second I/O terminal 104. In the first circuit 106, the second PMOS transistor 118 and the first NMOS transistor 120 are switched OFF and the first PMOS transistor 116 and the second NMOS transistor 122 switch ON.

Similarly, in order to shift a high voltage digital signal to a low voltage digital signal, the high voltage digital signal is applied at the second I/O terminal 104 (IOb) as an input. If the high voltage digital signal has a signal value close to the high power supply voltage (VDDb), i.e., logic HIGH, then the second PMOS transistor 118 and the first NMOS transistor 120 are switched ON. Also, the first PMOS transistor 116 and the second NMOS transistor 122 are switched OFF. Consequently, a voltage close to the low power supply voltage (VDDa), i.e., logic HIGH, is generated at the first I/O terminal 102. In the second circuit 108, the third NMOS transistor 130 and the fourth PMOS transistors 128 are switched ON and the third PMOS transistor 126 and the fourth NMOS transistor 132 are switched OFF.

If a high voltage digital signal having a signal value close to the reset voltage, i.e., logic LOW, is applied to the second I/O terminal 104, then the first PMOS transistor 116 and the second NMOS transistor 122 are switched ON. Also, the second PMOS transistor 118 and the first NMOS transistor 120 are switched OFF. As a result, a voltage close to the reset voltage (VSS), i.e., logic LOW, is generated at the first I/O terminal 102. In the second circuit 108, the third PMOS transistor 126 and the fourth NMOS transistor 132 are switched ON and the third NMOS transistor 130 and the fourth PMOS transistor 128 are switched OFF.

Figure 2A:
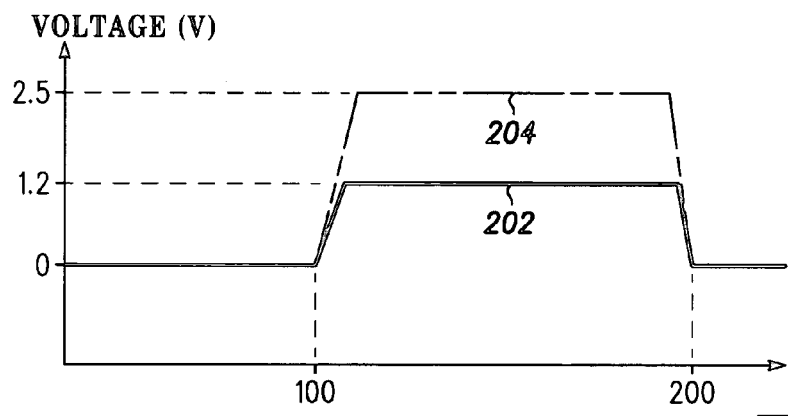
FIGS. 2a and 2b illustrate simulation waveforms for the circuit of FIG. 1, indicating the low-to-high voltage level shifting and the high-to-low voltage level shifting, respectively.
Figure 2B:
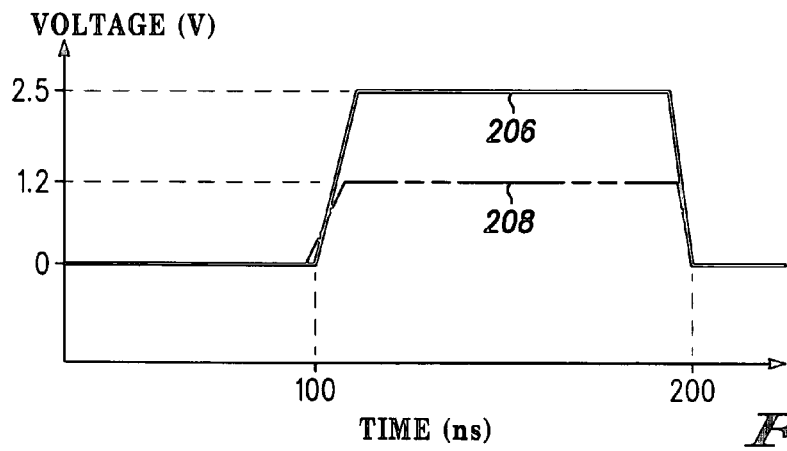

The voltage shifting of the bi-directional level shifter 100 is illustrated using FIGS. 2A and 2B. FIG. 2A illustrates a simulation waveform for shifting a low voltage digital signal 202, having a low power supply voltage of 1.2V, to a high voltage digital signal 204, having a high power supply voltage of 2.5V. FIG. 2B illustrates a simulation waveform for shifting a high voltage digital signal 206 with the high power supply voltage of 2.5V to a low voltage digital signal 208 with the low power supply voltage of 1.2V.

Figure 3:
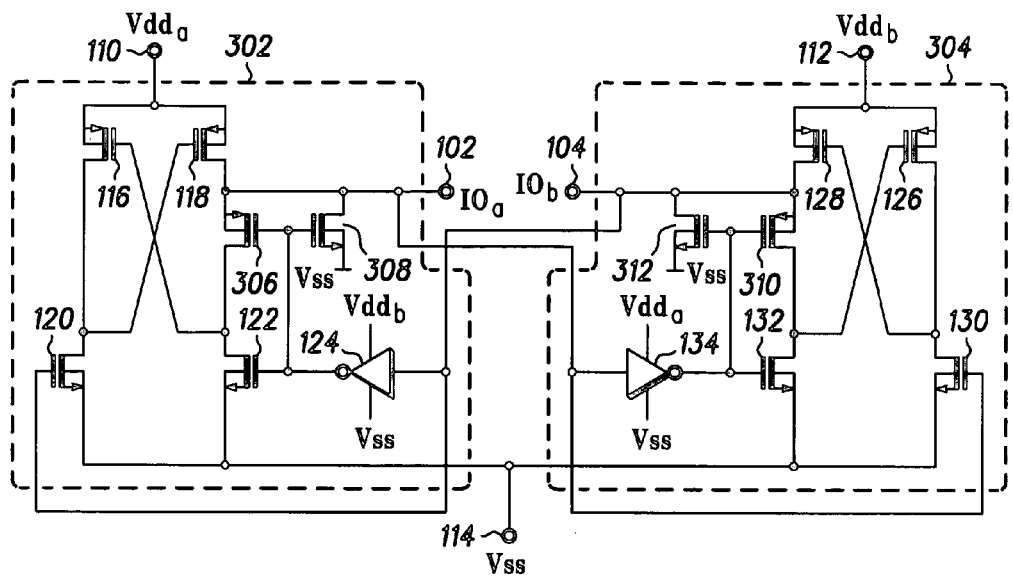
FIG. 3 is a schematic circuit diagram of a bi-directional level shifter circuit according to another embodiment of the present invention.

FIG. 3 shows a bi-directional level shifter circuit 300, in accordance with another embodiment of the present invention. The level shifter circuit 300 includes a first I/O terminal 102, a second I/O terminal 104, a first circuit 302 and a second circuit 304. The first circuit 302 is similar to the first circuit 106 (FIG. 1) and operates between the low power supply voltage (VDDa) and the reset voltage (VSS), while the second circuit 304 is similar to the second circuit 108 (FIG. 1) and operates between the high power supply voltage (VDDb) and the reset voltage (VSS).

The first circuit 302, in addition to the circuit elements discussed with reference to FIG. 1, includes a fifth PMOS transistor 306 and a fifth NMOS transistor 308. The fifth PMOS transistor 306 is connected in series between the second PMOS transistor 118 and the second NMOS transistor 122. More particularly, the drains of the fifth PMOS transistor 306 and the second NMOS transistor 122 are connected together. The drain of the fifth PMOS transistor 306 is also connected to the gate of the first PMOS transistor 116. The source and bulk of the fifth PMOS transistor 306 and the drain of the fifth NMOS transistor 308 are connected to the drain of the second PMOS transistor 118. The drain of the fifth NMOS transistor 308 is also connected to the first I/O terminal 102. The gates of the fifth PMOS transistor 306 and the fifth NMOS transistor 308 are connected to the gate of the second NMOS transistor 122. The source of the fifth NMOS transistor 308 receives the reset voltage (VSS).

When the voltage at the second I/O terminal 104 is shifted from a logic LOW to logic HIGH, the gates of the second NMOS transistor 122 and the fifth PMOS transistor 306 are at the low power supply voltage. Consequently, the fifth PMOS transistor 306 is switched OFF. As a result, the first I/O terminal 102 is disconnected from the second NMOS transistor 122. This allows for a smooth transition in voltage from LOW to HIGH at the first I/O terminal 102, even if the first I/O terminal 102 is driven by a low current or if the second NMOS transistor 122 draws a large current. The fifth NMOS transistor 308 is used to provide the discharge path for the first I/O terminal 102 and pulls the first I/O terminal 102 down to the reset voltage (VSS).

The second circuit 304 is like the second circuit 108 but includes a sixth PMOS transistor 310 and a sixth NMOS transistor 312. The sixth PMOS transistor 310 is connected between the fourth PMOS transistor 128 and the fourth NMOS transistor 132. More particularly, the drain of the sixth PMOS transistor 310 is connected to the drain of the fourth NMOS transistor 132 and to the gate of the third PMOS transistor 126. The source and bulk of the sixth PMOS transistor 310 are connected to the drain of the fourth PMOS transistor 128. The source of the sixth PMOS transistor 310 is also connected to the second I/O terminal 104 and to the drain of the sixth NMOS transistor 312. The gates of the sixth PMOS transistor 310 and the sixth NMOS transistor 312 are connected to each other and to the gate of the fourth NMOS transistor 132. The source of the sixth NMOS transistor 312 is connected to the reset voltage (VSS).

The sixth PMOS transistor 310 and the sixth NMOS transistor 312 have functionality similar to that of the fifth PMOS transistor 306 and the fifth NMOS transistor 308, respectively. The sixth PMOS transistor 310 ensures a smooth transition from LOW to HIGH at the second I/O terminal 104, even if driven by a low current or if the fourth NMOS transistor 128 draws a large current. The sixth NMOS transistor 312 is used to provide a discharge path for the second I/O terminal 104 and pulls the second I/O terminal 104 down to the reset voltage (VSS).

Figure 4A:
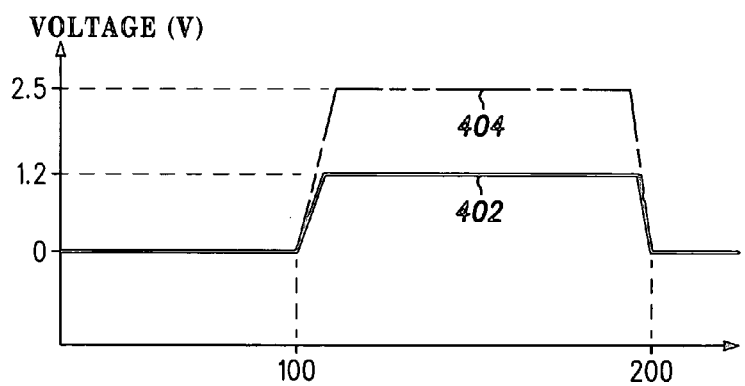
FIGS. 4a and 4b illustrate simulation waveforms for the circuit of FIG. 3, indicating the low-to-high voltage level shifting and the high-to-low voltage level shifting, respectively.
Figure 4B:
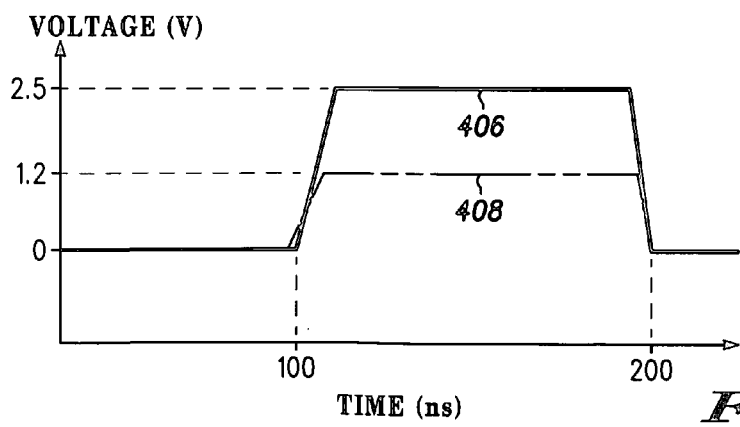

The performance of the bi-directional level shifter circuit 300 is illustrated using FIGS. 4A and 4B. FIG. 4A illustrates a simulation waveform for shifting a low voltage digital signal 402, having a low power supply voltage of 1.2V, to a high voltage digital signal 404, having a high power supply voltage of 2.5V. FIG. 4B illustrates a simulation waveform for shifting a high voltage digital signal 406, having a high power supply voltage of 2.5V, to a low voltage digital signal 408, having a low power supply voltage of 1.2V.

The operating voltages (VDDa and VDDb), as well as the reset voltage (VSS) for the bi-directional level shifters 100 and 300 can have a range of values. In an embodiment of the invention, the low power supply voltage is 1.2V; the high power supply voltage is 2.5V and the reset voltage is 0V. The choice of the operating voltages affects the sizes of the transistors (both NMOS and PMOS) used in the bi-directional level shifter of the present invention. The external devices that drive the first and second I/O terminals 102 and 104 also affect the sizes of the transistors. Also, each of the transistors should have a threshold voltage that is less than the power supply voltage required to switch ON the transistor.

The circuits 100 and 300 are able to level shift between two different VDD levels, VDDa and VDDb, where each supply has the same reference level (VSS). When the two supplies have different reference potentials (e.g., one is negative and the other is positive), the circuits 100 and 300 consume constant DC current. The constant DC current consumed increases as the difference between the two reference levels increases. In order to level shift the signal bi-directionally when the two supplies have different reference potentials, namely VSSa and VSSb, without a constant current flow, the circuit 300 has been further modified.

Figure 5:
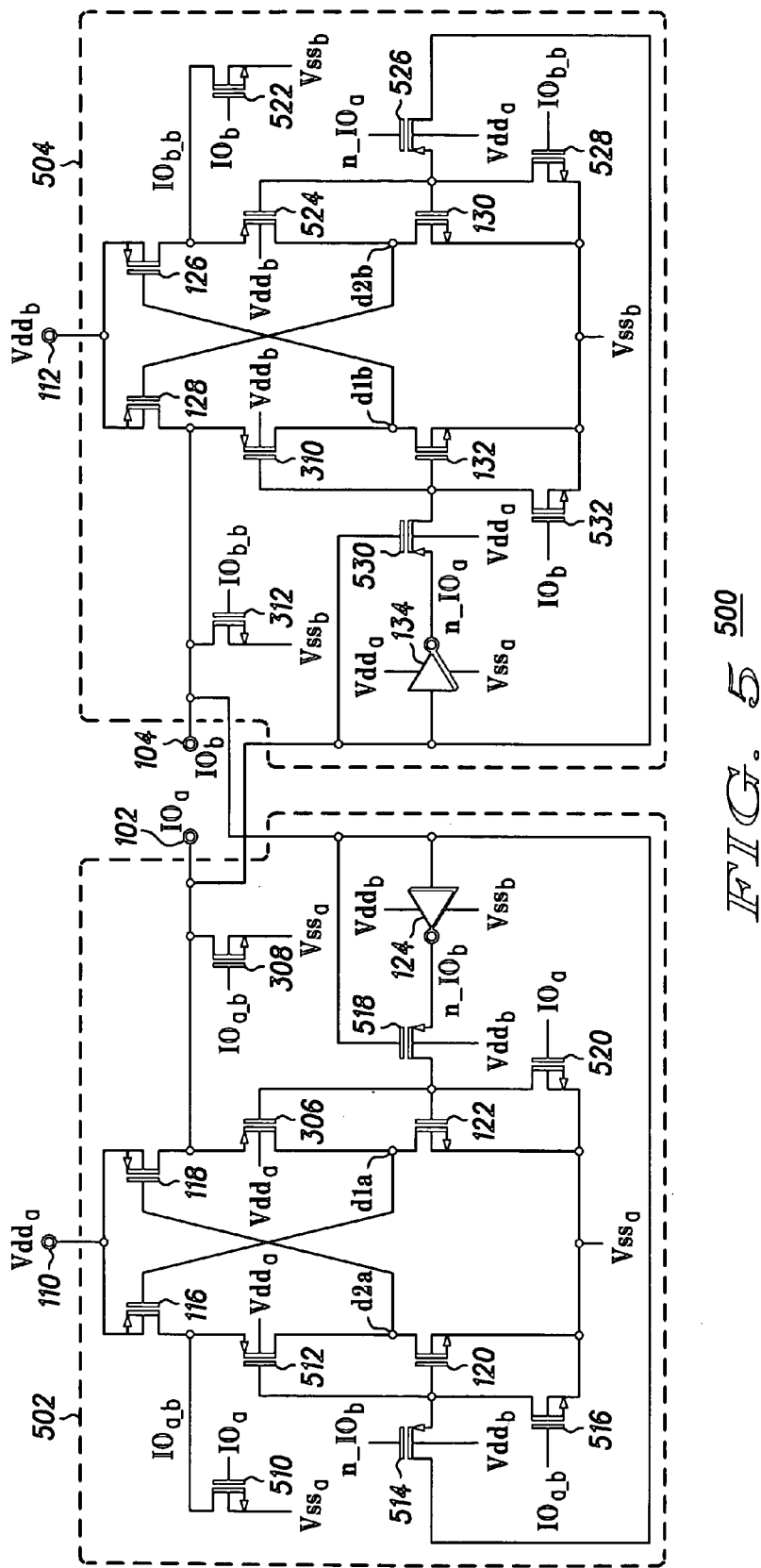
FIG. 5 is a schematic circuit diagram of a bi-directional level shifter circuit according to yet another embodiment of the present invention.

FIG. 5 is a schematic circuit diagram of a bi-directional level shifter 500 that performs bi-directional level shifting when there are two different reference potentials, VSSa and VSSb, and two different supplies, VDDa and VDDb. The signals IOa and IOb are the two input/outputs of the bi-directional level shifter 500 at first and second I/O terminals 102 and 104, respectively. The level shifter circuit 500 includes a first circuit 502 and a second circuit 504. The first circuit 502 is similar to the first circuit 306 (FIG. 3) and operates between the low power supply voltage (VDDa) and the first reference potential (VSSa), while the second circuit 504 is similar to the second circuit 304 (FIG. 3) and operates between the high power supply voltage (VDDb) and the second reference potential (VSSb). Some example voltage values for the shifter 500 are VDDa=1.2V, VSSa=0V, VDDb=1.25V and VSSb=−1.25V.

The first circuit 502, in addition to the circuit elements of the first circuit 302 discussed with reference to FIG. 3, includes a seventh NMOS transistor 510 having a drain connected to the drain of the first PMOS transistor 116, a source connected to the first reference potential VSSa, and a gate connected to the first I/O terminal 102 (IOa). A seventh PMOS transistor 512 is connected between the first PMOS transistor 116 and the first NMOS transistor 120. The source of the seventh PMOS transistor 512 is connected to the drain of the first PMOS transistor 116, the drain of the seventh PMOS transistor 512 is connected to the drain of the first NMOS transistor 120 and the gate of the second PMOS transistor 118, and the gate of the seventh PMOS transistor 512 is connected to the gate of the first NMOS transistor 120. The bulk of the seventh PMOS transistor 510 is connected to the low power supply voltage VDDa. An eighth PMOS transistor 514 has a source connected to the gate of the first NMOS transistor 120, a drain connected to the input of the first inverter 124 and the second I/O terminal 104, and a gate connected to the output of the first inverter 124 (i.e., n_IOb). The bulk of the eighth PMOS transistor 514 is connected to the high power supply voltage VDDb. An eighth NMOS transistor 516 has a drain connected to the gate of the first NMOS transistor 120, a source connected to the first reference potential VSSa, and a gate connected to the drain of the first PMOS transistor 116.

The first circuit 502 further has a ninth PMOS transistor 518 and a ninth NMOS transistor 520. The ninth PMOS transistor 518 has a source connected to the output of the first inverter 124, a drain connected to the gates of the second NMOS transistor 122 and the fifth PMOS transistor 306, a gate connected to the second I/O terminal 104, and a bulk connected to the high power supply voltage VDDb. The ninth NMOS transistor 520 has a source connected to the first reference potential VSSa, a drain connected to the gates of the second NMOS transistor 122 and the fifth PMOS transistor 306, and a gate connected to the first I/O terminal 102. Other differences of note between the first circuit 302 (FIG. 3) and the first circuit 502 are that the bulk of the fifth PMOS transistor 306 is connected to the low power supply voltage VDDa, the gate of the fifth NMOS transistor 308 is connected to the drain of the first PMOS transistor 116, and the first inverter 124 is connected to both the high power supply voltage VDDb and the second reference potential VSSb.

The second circuit 504 is similar to the first circuit 502 and includes tenth NMOS and PMOS transistors 522 and 524, eleventh PMOS and NMOS transistors 526 and 528, and twelfth PMOS and NMOS transistors 530 and 532. More particularly, the tenth NMOS transistor 522 has a drain connected to the drain of the third PMOS transistor 126, a source connected to the second reference potential VSSb, and a gate connected to the second I/O terminal 104 (IOb). The tenth PMOS transistor 524 is connected between the third PMOS transistor 126 and the third NMOS transistor 130. The source of the tenth PMOS transistor 524 is connected to the drain of the third PMOS transistor 126, the drain of the tenth PMOS transistor 524 is connected to the drain of the third NMOS transistor 130 and the gate of the fourth PMOS transistor 128, and the gate of the tenth PMOS transistor 524 is connected to the gate of the third NMOS transistor 130. The bulk of the tenth PMOS transistor 524 is connected to the high power supply voltage VDDb. The eleventh PMOS transistor 526 has a source connected to the gate of the third NMOS transistor 130, a drain connected to the input of the second inverter 134 and the first I/O terminal 102, and a gate connected to the output of the second inverter 134 (i.e., n_IOa). The bulk of the eleventh PMOS transistor 526 is connected to the low power supply voltage VDDa. The eleventh NMOS transistor 528 has a drain connected to the gate of the third NMOS transistor 130, a source connected to the second reference potential VSSb, and a gate connected to the drain of the third PMOS transistor 126.

The twelfth PMOS transistor 530 has a source connected to the output of the second inverter 134, a drain connected to the gates of the fourth NMOS transistor 132 and the sixth PMOS transistor 310, a gate connected to the first I/O terminal 102, and a bulk connected to the low power supply voltage VDDa. The twelfth NMOS transistor 532 has a source connected to the second reference potential VSSb, a drain connected to the gates of the fourth NMOS transistor 132 and the sixth PMOS transistor 310, and a gate connected to the second I/O terminal 104. As with the first circuit 502, other differences of note between the second circuit 304 (FIG. 3) and the second circuit 504 are that the bulk of the sixth PMOS transistor 310 is connected to the high power supply voltage VDDb, the gate of the sixth NMOS transistor 312 is connected to the drain of the third PMOS transistor 126, and the second inverter 134 is connected to both the low power supply voltage VDDa and the first reference potential VSSa.

The operation of the level shifter 500 will now be described. Suppose an input signal is applied at IOa that swings between 0V and 1.2V. For the case when IOa=0V, n_IOa=1.2V and the gate voltage of the sixth PMOS transistor 310 is charged to 1.2V because the twelfth PMOS transistor 530 is ON. Thus, the fourth NMOS transistor 132 turns ON, which brings the gate voltage of the third PMOS transistor 126 to −1.25V (VSSb). At the same time, the sixth PMOS transistor 310 is OFF. Therefore, the gate of the third PMOS transistor 126 is disconnected from the second I/O terminal IOb. The eleventh PMOS transistor 526 will be OFF. Since the gate voltage of the third PMOS transistor 126 is at −1.25V, the third PMOS transistor 126 turns ON and pulls its drain voltage (IOb_b) to 1.25V (VDDb). Hence, the sixth NMOS transistor 312 turns ON and pulls the second I/O terminal 104 (IOb) to −1.25V, which turns OFF the twelfth NMOS transistor 532 and the tenth NMOS transistor 522. The eleventh NMOS transistor 528 turns ON, which brings the gate voltage of the tenth PMOS transistor 524 to −1.25V, thus turning OFF the third NMOS transistor 130 and turning ON the tenth PMOS transistor 524, which brings the gate voltage of the fourth PMOS transistor 128 to 1.25V (since the third PMOS transistor 126 is also ON), thus turning OFF the fourth PMOS transistor 128.

The sixth and tenth PMOS transistors 310 and 524 help in isolating the nodes at the second I/O terminal 104 and the drain of the third PMOS transistor 126 from the nodes d1b and d2b, respectively, which does not allow the nodes IOb and IOb_b to be stuck at either 1.25V or −1.25V due to the presence of a finite delay between the change in signal IOa and change in signal IOb. Thus, when IOa=0V, IOb will be at −1.25V and IOb_b will be at 1.25V. No constant DC current flows because all the paths from VDDb to VSSb and from VDDa to VSSa are cutoff. The shifter 500 consumes current only during the transition phase.

At the same time, in the first circuit 502, since the second I/O terminal 104 is at −1.25V, the output of the first inverter 124, n_IOb, is at logic HIGH (1.25V), which switches OFF the eighth PMOS transistor 514. The ninth PMOS transistor 518 turns ON, which charges the gate of the second NMOS transistor 122 to VDDb, thus switching ON the second NMOS transistor 122 and switching OFF the fifth PMOS transistor 306. This brings node d1a to VSSa and therefore, the first PMOS transistor 116 switches ON, which pulls the node IOa_b to VDDa (1.2V). Therefore, the eighth NMOS transistor 516 switches ON and brings the gate of the first NMOS transistor 120 to VSSa, thus switching OFF the first NMOS transistor 120 and switching ON the seventh PMOS transistor 512. Thus, node d2a is pulled to the voltage VDDa because the first PMOS transistor 116 is ON, switching OFF the second PMOS transistor 118. No constant DC current flows because all the paths from VDDb to VSSb and from VDDa to VSSa are cutoff. The shifter 500 consumes current only during the transition phase.

For the case when IOa=1.2V, as with the description above, when IOa is changed from 0V to 1.2V, initially the node IOb is at −1.25V and the node IOb_b is at 1.25V. The node at the output of the second inverter 134 (n_IOa) will become 0V and the twelfth PMOS transistor 530 will turn OFF. The gate voltage of the sixth PMOS transistor 310 will remain at 1.2V because there is no discharge path. The eleventh PMOS transistor 526 will turn ON (because the output of the second inverter 134 is 0V), which will charge the gate voltage of the tenth PMOS transistor 524 to 1.2V from −1.25V. Therefore, the third NMOS transistor 130 will turn ON and the tenth PMOS transistor 524 will turn OFF. The third NMOS transistor 130 will bring the node d2b to −1.25V, which will turn ON the fourth PMOS transistor 128, which will pull node IOb to 1.25V (VDDb). With IOb=1.25V, the tenth and twelfth NMOS transistors 522 and 532, respectively, will turn ON and pull the gate voltage of the fourth NMOS transistor 132 and the node IOb_b, respectively, to −1.25V. Therefore, the fourth and sixth NMOS transistors 132 and 312, respectively, will turn OFF and the sixth PMOS transistor 310 will turn ON, which will bring node d1b to 1.25V, thus turning OFF the third PMOS transistor 126. Thus, when IOa=1.2V, IOb will become 1.25V and IOb_b will become −1.25V. Again, there will be no constant DC current flow because all the paths from VDDb to VSSb and from VDDa to VSSa turn OFF.

Since the shifter 500 is symmetrical, the above description holds true when VDDa=1.25V, VSSa=−1.25V, VDDb=1.2V and VSSb=0V. When a signal applied to IOb swings between 0 and 1.2V, the signal at IOa will swing from −1.25V to 1.25V.

Figure 6:
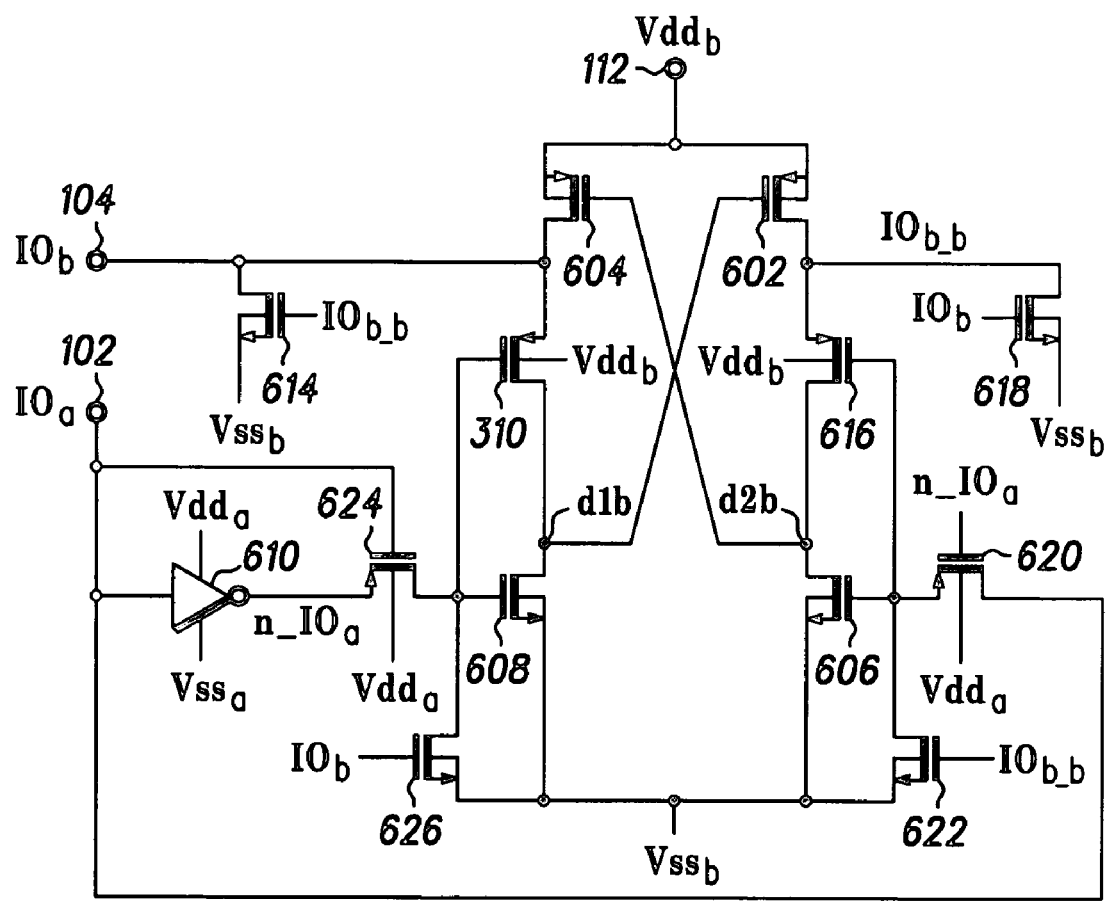
FIG. 6 is a schematic circuit diagram of a unidirectional level shifter circuit according to an embodiment of the present invention.

One half of the level shifter circuit 500 shown in FIG. 5 can also be used as a single ended level shifter 600 for shifting a single supply signal into a dual supply, as shown in FIG. 6. The input is applied at terminal IOa and output is provided at IOb. The single ended level shifter 600 is useful when the input signal having LOW voltage at ground and HIGH voltage at some positive reference needs to be shifted to a signal having LOW voltage at some negative reference and HIGH voltage at some positive reference. For example, if the input signal swing is from 0V to 1.2V, then it could be shifted to −1.25V to 1.25V.

The single ended level shifter 600 includes a first PMOS transistor 602, a second PMOS transistor 604, a first NMOS transistor 606 and a second NMOS transistor 608. The sources of the first and second PMOS transistors 602 and 604 are connected to a high power supply voltage (VDDb). A drain of the second PMOS transistor 604 is connected to the output terminal 104. The sources of the first and second NMOS transistors 606 and 608 are connected to a first reference voltage (VSSb). The drain of the first NMOS transistor 606 is connected to a gate of the second PMOS transistor 604 and a drain of the second NMOS transistor 608 is a gate of the first PMOS transistor 602. An inverter 610 has an input connected to the input terminal 102 and receives the input digital signal. The inverter 610 is coupled between a low power supply voltage and a second reference voltage (VSSa). A third PMOS transistor 612 has a source connected to the drain of the second PMOS transistor 604, a drain connected to the drain of the second NMOS transistor 608, and a gate connected to a gate of the second NMOS transistor 608. A third NMOS transistor 614 has a source connected to the first reference voltage (VSSb), a drain connected to the output terminal 104, and a gate connected to a drain of the first PMOS transistor 602. A fourth PMOS transistor 616 has a source connected to the drain of the first PMOS transistor 602, a drain connected to the drain of the first NMOS transistor 606, and a gate connected to a gate of the first NMOS transistor 606. A fourth NMOS transistor 618 has a source connected to the first reference voltage (VSSb), a drain connected to the drain of the first PMOS transistor 602, and a gate connected to the output terminal 104. A fifth PMOS transistor 620 has a source connected to the gate of the first NMOS transistor 606, a drain connected to the input terminal 102, and a gate connected to the output of the inverter 610. A fifth NMOS transistor 622 has a source connected to the first reference voltage (VSSb), a drain connected to the gates of the first NMOS transistor 606 and the fourth PMOS transistor 616, and a gate connected to the drain of the first PMOS transistor 602. A sixth PMOS transistor 624 has a source connected to the output of the inverter 610, a drain connected to the gates of the second NMOS transistor 608 and the third PMOS transistor 612, and a gate connected to the input of the inverter 610. A sixth NMOS transistor 626 has a source connected to the first reference voltage (VSSb), a drain connected to the gate of the second NMOS transistor 608, and a gate connected to the output terminal 104. In addition, the bulks of the third and fourth PMOS transistors 612 and 616 are connected to the high power supply voltage (VDDb), and the bulks of the fifth and sixth PMOS transistors are connected to the low power supply voltage (VDDa).

While the various embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A bi-directional level shifter for shifting a low voltage digital signal to a high voltage digital signal and vice versa, the bi-directional level shifter comprising:

a first I/O terminal for sending and receiving the low voltage digital signal, the first I/O terminal receiving the low voltage digital signal as an input when the bi-directional level shifter shifts the low voltage digital signal to the high voltage digital signal, and the first I/O terminal sending the low voltage digital signal as an output when the bi-directional level shifter shifts the high voltage digital signal to the low voltage digital signal;

a second I/O terminal for sending and receiving the high voltage digital signal, the second I/O terminal receiving the high voltage digital signal as an input when the bi-directional level shifter shifts the high voltage digital signal to the low voltage digital signal, and the second I/O terminal sending the high voltage digital signal as an output when the bi-directional level shifter shifts the low voltage digital signal to the high voltage digital signal;

a first circuit operating at a low power supply voltage, the circuit comprising:

a first PMOS transistor having a source connected to the low power supply voltage;

a second PMOS transistor having a source connected to the low power supply voltage and a drain connected to the first I/O terminal;

a first NMOS transistor having a drain connected to a gate of the second PMOS transistor, and a source connected to a first reference voltage;

a second NMOS transistor having a drain connected to a gate of the first PMOS transistor, and a source connected to the first reference voltage;

a first inverter having an input connected to the second I/O terminal for receiving the high voltage digital signal, and an output;

a fifth PMOS transistor having a gate connected to the gate of the second NMOS transistor, a source connected to the drain of the second PMOS transistor, and a drain connected to the drain of the second NMOS transistor;

a fifth NMOS transistor having a drain connected to the first I/O terminal, a source connected to the first reference voltage, and a gate connected to the drain of the first PMOS transistor;

a seventh NMOS transistor having a gate connected to the first I/O terminal, a source connected to the first reference voltage, and a drain connected to the drain of the first PMOS transistor;

a seventh PMOS transistor having a source connected to the drain of the first PMOS transistor, a drain connected to the drain of the first NMOS transistor, and a gate connected to a gate of the first NMOS transistor;

an eighth PMOS transistor having a source connected to the gate of the first NMOS transistor, a gate connected to the output of the first inverter, and a drain connected to the input of the first inverter;

an eighth NMOS transistor having a drain connected to the gate of the first NMOS transistor, a gate connected to the drain of the first PMOS transistor, and a source connected to the first reference voltage;

a ninth PMOS transistor having a source connected to the output of the first inverter, a drain connected to the gates of the second NMOS transistor and the fifth PMOS transistor, and a gate connected to the input of the first inverter; and a ninth NMOS transistor having a source connected to the first reference voltage, a drain connected to the gates of the second NMOS transistor and the fifth PMOS transistor, and a gate connected to the first I/O terminal; and a second circuit operating at a high power supply voltage, the second circuit comprising:

a third PMOS transistor having a source connected to the high power supply voltage;

a fourth PMOS transistor having a source connected to the high power supply voltage, and a drain connected to the second I/O terminal;

a third NMOS transistor having a source connected to a second reference voltage, and a drain connected to a gate of the fourth PMOS transistor;

a fourth NMOS transistor having a source connected to the second reference voltage, and a drain connected to a gate of the third PMOS transistor;

a second inverter having an input connected to the first I/O terminal for receiving the low voltage digital signal, and an output;

a sixth PMOS transistor having a gate connected to a gate of the fourth NMOS transistor, a source connected to the drain of the fourth PMOS transistor, and a drain connected to the drain of the fourth NMOS transistor;

a sixth NMOS transistor having a drain connected to the second I/O terminal, a source connected to the second reference voltage, and a gate connected to a drain of the third PMOS transistor;

a tenth NMOS transistor having a gate connected to the second I/O terminal, a source connected to the second reference voltage, and a drain connected to the drain of the third PMOS transistor;

a tenth PMOS transistor having a source connected to the drain of the third PMOS transistor, a drain connected to the drain of the third NMOS transistor, and a gate connected to a gate of the third NMOS transistor;

an eleventh PMOS transistor having a source connected to the gate of the third NMOS transistor, a gate connected to the output of the second inverter, and a drain connected to the input of the second inverter;

an eleventh NMOS transistor having a drain connected to the gates of the third NMOS transistor and the tenth PMOS transistor, a source connected to the second reference voltage, and a gate connected to the drain of the third PMOS transistor;

a twelfth PMOS transistor having a source connected to the output of the second inverter, a drain connected to the gates of the fourth NMOS transistor and the sixth PMOS transistor, and a gate connected to the input of the second inverter; and a twelfth NMOS transistor having a source connected to the second reference voltage, a drain connected to the gates of the fourth NMOS transistor and the sixth PMOS transistor, and a gate connected to the second I/O terminal.

2. The level shifter of claim 1, wherein the first inverter is coupled between the high power supply voltage and the second reference voltage and the second inverter is coupled between the low power supply voltage and the first reference voltage.

3. The level shifter of claim 2, wherein a bulk of the fifth PMOS transistor is connected to the low power supply voltage, a bulk of the seventh PMOS transistor is connected to the low power supply voltage, a bulk of the eighth PMOS transistor is connected to the high power supply voltage, and a bulk of the ninth PMOS transistor is connected to the high power supply voltage.

4. The level shifter of claim 3, wherein a bulk of the sixth PMOS transistor is connected to the high power supply voltage, a bulk of the tenth PMOS transistor is connected to the high power supply voltage, a bulk of the eleventh PMOS transistor is connected to the low power supply voltage, and a bulk of the twelfth PMOS transistor is connected to the low power supply voltage.

5. A single ended level shifter for shifting an input digital signal operating between first and second operating parameters to an output digital signal operating between third and fourth operating parameters that are different from the first and second operating parameters, the single ended level shifter comprising:
  an input terminal receiving the input digital signal;
  an output terminal for providing the output digital signal;
  a first PMOS transistor having a source connected to a high power supply voltage;
  a second PMOS transistor having a source connected to the high power supply voltage, and a drain connected to the output terminal;
  a first NMOS transistor having a source connected to a first reference voltage, and a drain connected to a gate of the second PMOS transistor;
  a second NMOS transistor having a source connected to the first reference voltage, and a drain connected to a gate of the first PMOS transistor;
  an inverter having an input connected to the input terminal for receiving the input digital signal, and an output, wherein the inverter is coupled between a low power supply voltage and a second reference potential;
  a third PMOS transistor having a source connected to the drain of the second PMOS transistor, a drain connected to the drain of the second NMOS transistor, and a gate connected to a gate of the second NMOS transistor;
  a third NMOS transistor having a source connected to the first reference voltage, a drain connected to the output terminal, and a gate connected to drain of the first PMOS transistor;
  a fourth PMOS transistor having a source connected to the drain of the first PMOS transistor, a drain connected to the drain of the first NMOS transistor, and a gate connected to a gate of the first NMOS transistor;
  a fourth NMOS transistor having a source connected to the first reference voltage, a drain connected to the drain of the first PMOS transistor, and a gate connected to the output terminal;
  a fifth PMOS transistor having a source connected to the gate of the first NMOS transistor, a drain connected to the input terminal, and a gate connected to the output of the inverter;
  a fifth NMOS transistor having a source connected to the first reference voltage, a drain connected to the gate of the first NMOS transistor, and a gate connected to the drain of the first PMOS transistor;
  a sixth PMOS transistor having a source connected to the output of the inverter, a drain connected to the gate of the second NMOS transistor, and a gate connected to the input of the inverter; and
  a sixth NMOS transistor having a source connected to the first reference voltage, a drain connected to the gate of the second NMOS transistor, and a gate connected to the output terminal.

6. The level shifter of claim 5, wherein a bulk of the third PMOS transistor is connected to the high power supply voltage, a bulk of the fourth PMOS transistor is connected to the high power supply voltage, a bulk of the fifth PMOS transistor is connected to the low power supply voltage, and a bulk of the sixth PMOS transistor is connected to the low power supply voltage.

* * * * *